United States Patent

Smith et al.

[11] Patent Number: 5,838,152
[45] Date of Patent: Nov. 17, 1998

[54] PULSE TIMER CIRCUIT

[75] Inventors: Geoffrey Smith, Bristol, Great Britain; Jiapal S. Brar, Chandigarh (U-T), India

[73] Assignee: Matra Bae Dynamics, (UK) Ltd., Hertfordshire, United Kingdom

[21] Appl. No.: 680,970

[22] Filed: Jul. 16, 1996

[30] Foreign Application Priority Data

Jul. 17, 1995 [GB] United Kingdom .................. 9514618

[51] Int. Cl.$^6$ .................................................. H03K 3/284
[52] U.S. Cl. ............................................ 323/907; 327/228
[58] Field of Search .......................... 323/907; 327/214, 327/228

[56] References Cited

U.S. PATENT DOCUMENTS

| | | |
|---|---|---|
| 3,573,506 | 4/1971 | Morris . |
| 3,813,562 | 5/1974 | Stehlin ........................ 327/228 |
| 4,328,419 | 5/1982 | Lefebvre .................... 250/214 R |
| 4,687,622 | 8/1987 | Longden . |
| 5,081,625 | 1/1992 | Rhee et al. ................ 395/185.08 |

FOREIGN PATENT DOCUMENTS 1322253  8/1970  United Kingdom .

Primary Examiner—Stuart N. Hecker
Attorney, Agent, or Firm—Nixon & Vanderhye P.C.

[57] ABSTRACT

A pulse timer circuit comprising a monostable multivibrator which includes two complementary transistors Q5, Q6, has the advantage of good tolerance to temperature fluctuation owing to the provision of a Schottky diode D4 connected between the emitter and base of one of the transistors Q5. The Schottky diode, D4, which has a temperature coefficient matched to that of the transistor Q5, ensures that the output pulse width from the monostable is unaffected by fluctuations in ambient temperature.

8 Claims, 1 Drawing Sheet

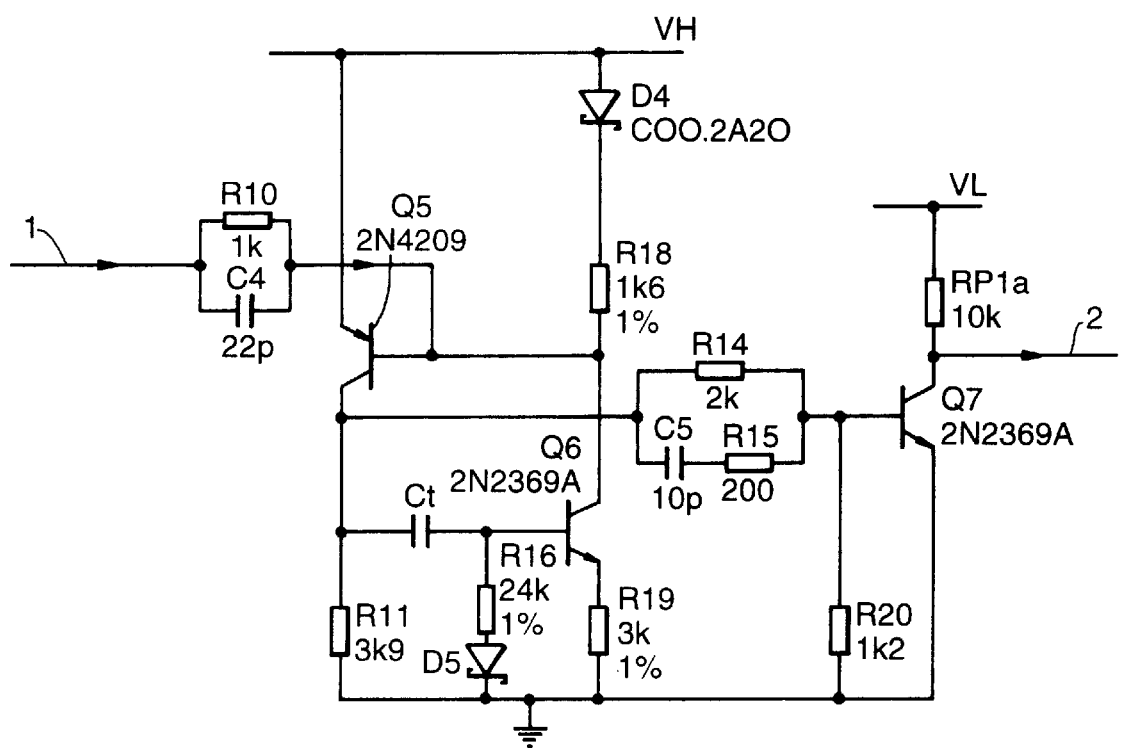

PULSE TIMER CIRCUIT

This invention relates to a pulse timer circuit particularly, though not exclusively, suitable for use with a nuclear event detector.

It is known that exploding nuclear weapons produce pulses of ionising radiation eg X rays and gamma rays. This radiation can cause damage to unprotected electronic components. To minimize the harmful effects of such radiation, it is usual to employ a nuclear event detector coupled to an appropriate form of protection circuit.

Known nuclear event detectors (see for example U.S. Pat. No. 4,687,622) sense a pulse of ionising radiation and themselves generate a pulse of pre-set duration which activates, for example, a power supply crowbar circuit. Circuits of this type can remove the power from the vulnerable electronic components within a very short timescale.

The nuclear event detector of U.S. Pat. No. 4,687,622 includes an ionising radiation sensor which provides an output signal when an incident pulse exceeds a threshold level. It further includes a pulse timer circuit, responsive to the output signal for providing a timing signal pulse of predetermined duration. Also included is a latch circuit, triggered by the output of the timer circuit which provides a flag signal indicating that an ionising pulse has been sensed. The timing signal pulse can be used to quickly trigger associated protection circuitry. The nuclear event detector disclosed in U.S. Pat. No. 4,687,622 has the disadvantage of a low tolerance to temperature variation.

An object of this invention is to provide temperature compensated circuitry suitable for incorporation in a nuclear event detector.

According to this invention, a temperature-compensated pulse timer circuit comprises a monostable multivibrator including a pair of complementary transistors and a device, connected across the base and emitter of one of said pair of transistors, whose temperature coefficient is closely matched to that of said one of the transistor pair.

The pulse timer circuit may be advantageously incorporated in the nuclear event detector as described and claimed in our co-pending application GB 9514618.9.

An embodiment of the invention will now be described, by way of example only, with reference to the drawing which is a circuit diagram of a pulse timer circuit.

The circuit shown in the drawing is essentially a monostable multivibrator which includes a pair of complementary transistors Q5 and Q6. Q5 is a PNP type and Q6 is an NPN type transistor. Choosing a complementary pair ensures that the monostable circuit has good radiation tolerance. It also consumes negligible power in the standby state.

The width of the timing pulse generated by the monostable multivibrator can be set by an appropriate choice of value of a timing capacitor Ct., which is connected between the collector of Q5 and the base of Q6. However, pulse width is affected to a certain degree by variations in ambient temperature. This variation is primarily due to the (non-linear) variation of the base-emitter voltage $V_{BE}(ON)$ of the transistor Q5 with temperature. The base-emitter voltage variation with temperature of Q6 is also a contributory factor, as can be variations in power supply voltage.

To minimize the effect of temperature variations on pulse width owing to the behavior of Q5, an additional component is connected across the emitter and base of Q5, this component (ideally) having an equal temperature coefficient. The additional component could be a negative temperature coefficient resistor. However, this solution is not perfect because the temperature coefficient of the resistor is linear whereas that of transistor Q5 is non-linear.

A better solution is to use a resistor R18 in series with a Schottky diode D4 as shown in the drawing.

The forward voltage change ( $V_F$) in Schottky diodes with respect to temperature is almost equal to that of the base-emitter junction of the bipolar transistors (approximately −2.2 mV/°C.) but the magnitude of $V_F$ is less than half (200 mV to 300 mV instead of 600 mV). This leaves at least 300 mV head room for transistor Q5 base-emitter excursions, which is sufficient to allow unrestricted operation of the circuit.

Commonly available Schottky diodes fall into two distinct categories viz. low barrier height types and high barrier height types. The former are optimized for forward characteristics at the expense of reverse leakage and are intended for low voltage switching power supplies. The latter are optimized for reverse leakage at the expense of forward voltage drop and are intended for general applications. For the nuclear event detector application, the high barrier type is recommended.

Further improvement is possible by compensation for Q6 base-emitter voltage variation by employing a further component having a temperature coefficient equal to that of Q6 across the base and emitter of Q6. This could comprise a negative temperature coefficient resistor or preferably a further Schottky diode D5 in series with a resistor R16.

In operation, the circuit is triggered by a low-going trigger input on line 1 which is applied to the base of Q5 via a bias resistor R10 connected in parallel with a speed-up capacitor C4.

When Q5 is switched ON by the current pulse applied to its base, it turns ON Q6 via Ct. Both transistors are maintained in the ON state by regenerative feedback until the voltage across R16 can no longer maintain Q6 collector current. Due to the relatively low value of R18, transistor Q5 is essentially voltage controlled and both of the transistors will rapidly switch OFF.

The output from the monostable i.e. from the collector of Q5, goes to the base of an open collector output drive transistor Q7 via a drive resistor R14 connected in parallel with speed-up coponents C5 and R15. The transistor Q7 acts as an output buffer and is powered from a power rail VL via a pull-up resistor RP1a.

We claim:

1. A temperature-compensated pulse timer circuit comprising a monostable multivibrator including a pair of complementary transistors and a first device, connected across the base and emitter of a first of said pair of transistors, whose temperature coefficient is closely matched to that of said first of the transistor pair.

2. A temperature compensated pulse timer circuit according to claim 1 and further including a second device connected across the base and emitter of a second of said pair of transistors, whose temperature coefficient is closely matched to that of said second of the transistor pair.

3. A temperature compensated pulse timer circuit according to claim 1 in which said first device is a negative temperature coefficient resistor.

4. A temperature compensated pulse timer circuit according to claim 1 in which said first device is a Schottky diode.

5. A temperature compensated pulse timer circuit according to claim 2 in which said second device is a negative temperature resistor.

6. A temperature compensated pulse timer circuit according to claim 2 in which said second device is a Schottky diode.

7. A temperature compensated pulse timer circuit according to claim 1 including an open collector output drive transistor to which the output of the monostable multivibrator is connected.

8. A temperature-compensated pulse timer circuit according to claim 7 in which resistive and capacitative components are provided between the output of the monostable multivibrator and the input of the drive transmitter for reducing the turn-on delay time of the drive transistor.

* * * * *